United States Patent
Giles et al.

(10) Patent No.: US 7,244,809 B2
(45) Date of Patent: Jul. 17, 2007

(54) MONO-, OLIGO- AND POLYMERS COMPRISING DITHIENOTHIOPHENE AND ARYL GROUPS

(75) Inventors: Mark Giles, Southampton (GB);
Marcus Thompson, Christchurch (GB);
Iain McCulloch, Southampton (GB)

(73) Assignee: Merck Patent GmbH, Darmstadt (DE)

( * ) Notice: Subject to any disclaimer, the term of this patent is extended or adjusted under 35 U.S.C. 154(b) by 398 days.

(21) Appl. No.: 10/844,443

(22) Filed: May 13, 2004

(65) Prior Publication Data

US 2004/0230021 A1    Nov. 18, 2004

(30) Foreign Application Priority Data

May 16, 2003   (EP)   .................... 03010952

(51) Int. Cl.
*C08G 75/00*    (2006.01)

(52) U.S. Cl. ..................................... 528/380

(58) Field of Classification Search .................. 528/380
See application file for complete search history.

(56) References Cited

U.S. PATENT DOCUMENTS

| | | |
|---|---|---|
| 6,403,809 B1 | 6/2002 | Holmes et al. |
| 2003/0042471 A1 | 3/2003 | Heeney et al. |
| 2003/0047720 A1 | 3/2003 | Heeney et al. |

FOREIGN PATENT DOCUMENTS

| | | | |
|---|---|---|---|
| EP | 1 275 650 | * | 1/2003 |
| EP | 1 275 651 | * | 1/2003 |
| WO | WO 99/12989 A | | 3/1999 |
| WO | WO 03/006468 A | | 1/2003 |

* cited by examiner

*Primary Examiner*—Margaret G. Moore
(74) *Attorney, Agent, or Firm*—Millen, White, Zelano & Branigan, PC

(57) ABSTRACT

The invention relates to mono-, oligo- and polymers comprising a dithienothiophene group and an aryl group useful as semiconductors or charge transport materials in optical, electrooptical or electronic devices including field effect transistors, electroluminescent, photovoltaic and sensor devices.

28 Claims, No Drawings

MONO-, OLIGO- AND POLYMERS COMPRISING DITHIENOTHIOPHENE AND ARYL GROUPS

FIELD OF INVENTION

The invention relates to mono-, oligo- and polymers, in particular conjugated copolymers, comprising a dithienothiophene group and an aryl group. The invention further relates to methods of their preparation, to their use as semiconductors or charge transport materials in optical, electrooptical or electronic devices including field effect transistors, electroluminescent, photovoltaic and sensor devices. The invention further relates to field effect transistors and semiconducting components comprising the new materials.

BACKGROUND AND PRIOR ART

Organic materials have recently shown promise as the active layer in organic based thin film transistors and organic field effect transistors [see reference 1]. Such devices have potential applications in smart cards, security tags and the switching element in flat panel displays. Organic materials are envisaged to have substantial cost advantages over their silicon analogues if they can be deposited from solution, as this enables a fast, large-area fabrication route.

The performance of the device is principally based upon the charge carrier mobility of the semiconducting material and the current on/off ratio, so the ideal semiconductor should have a low conductivity in the off state, combined with a high charge carrier mobility ($>1\times10^{-3}$ cm$^2$ V$^{-1}$ s$^{-1}$). In addition, it is important that the semiconducting material is relatively stable to oxidation i.e. it has a high ionisation potential, as oxidation leads to reduced device performance.

Compounds known in prior art which have been shown to be effective p-type semiconductors for organic FETs are dithienothiophene (DTT) (1) and its fused dimer α,α'-bis(dithieno[3,2-b:2',3'-d]thiophene (BDT) (2) having the structures shown below [see reference 2-4].

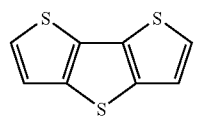

1 DTT

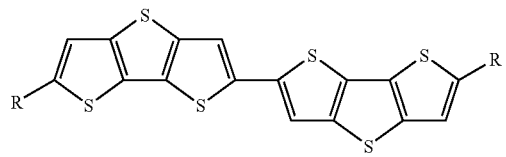

2 R = H BDT
3 R = Alkyl

In particular BDT, which has been extensively studied, has been shown to be an effective p-type semiconductor for organic FETs with a very high charge carrier mobility between $1\times10^{-3}$ and $5\times10^{-2}$ cm$^2$ V$^{-1}$ s$^{-1}$ and very high current on/off ratios (up to $10^8$). BDT also has been found in the solid state to have a completely coplanar formation, and to be more planar than oligomers of thiophene.

However, BDT has a high melting point and is very insoluble, therefore, if used as the active layer in an organic thin film transistor, it cannot be readily solution processed. As a result, for applications like FETs, prior art materials like BDT are usually deposited as a thin film by vacuum deposition, which is an expensive processing technique that is unsuitable for the fabrication of large-area films. To improve the solubility of BDT, several substituted derivatives have so far been synthesized (3), [see reference 4] but these have still required vacuum processing when used in thin film transistors.

Thus, an aspect of the present invention is to provide new materials for use as semiconductors or charge transport materials, which are easy to synthesize, have high charge mobility and are easily processible to form thin and large-area films for use in semiconductor devices. Other aspects of the invention are immediately evident to those skilled in the art from the following description.

The inventors have found that these aims can be achieved by providing new aryl copolymers of dithienothiophene (DTT).

Polymers containing DTT have been previously synthesised. DTT can be polymerised electrochemically but an insoluble material containing many structural defects is produced [see references 5,6]. Similarly copolymers with dithienopyrrole have also been made (4) [see reference 7]. DTT has also been incorporated into vinylidene polymers either via Knoevenagel (5) [see reference 8] or Wittig reactions (6) [see reference 9]. The latter gave insoluble polymers, whereas the former produced polymers that were soluble but had only moderate photovoltaic or photoconductive behaviour.

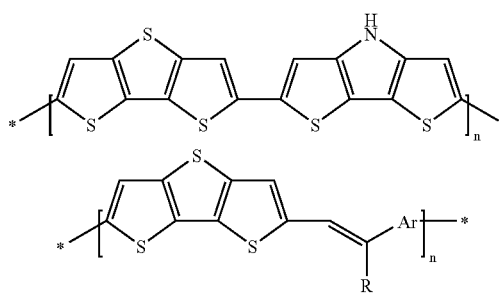

5 R = H, Ar = aryl
6 R = CN, Ar = aryl

DTT dimers and homo polymers of DTT and copolymers of DTT and thiophenes are reported in the international patent application WO 99/12989 [reference 10]. However, no characterisation or details of the synthetic route of the polymers are disclosed.

One drawback of the thiophene based materials of prior art is the energy of the highest occupied molecular orbital (HOMO), around 4.9 eV. This electronic orbital energy is susceptible to electron removal via oxidation which, although often increasing the mobility, also increases the bulk conductivity of the material, and in addition, introduces a time dependence of conductivity when exposed to the air. High bulk conductivity can lead to a high OFF current in a transistor, and hence a low ON/OFF ratio, which is undesirable.

The inventors of the present invention have found that copolymerisation of DTT with other aromatic species provides a method to tune the position of the HOMO and hence improve the ON/OFF ratio and decrease the susceptability to air oxidation. It was also found that the use of substituted aromatics as comonomers will also combat the intrinsic insolubility of the DTT unit to yield solution processable polymers, thus avoiding the high costs associated with vacuum processing. Variation of the aromatic comonomer may also be used to enhance the liquid crystal behaviour of the polymers. The introduction of order in the polymer films leads to higher carrier mobility and liquid crystallinity is therefore a useful property. Thiophene boronic acids do not couple effectively therefore use of non-thiophene comonomers also allows for efficient Suzuki polymerisations.

A further aspect of the invention relates to reactive mesogens having a central core comprising a DTT-arylene unit, said core being linked, optionally via a spacer group, to one or two polymerisable groups. The reactive mesogens can induce or enhance liquid crystal phases or are liquid crystalline themselves. They can be oriented in their mesophase and the polymerisable group(s) can be polymerised or crosslinked in situ to form polymer films with a high degree of order, thus yielding improved semiconductor materials with high stability and high charge carrier mobility.

A further aspect of the invention relates to liquid crystal polymers like liquid crystal main chain or side chain polymers, in particular liquid crystal side chain polymers obtained from the reactive mesogens according to the present invention, which are then further processed, e.g., from solution as thin layers for use in semiconductor devices.

SUMMARY OF THE INVENTION

The invention relates to mono-, oligo- or polymers comprising at least one dithienothiophene (DTT) group and at least one arylene or heteroarylene group, each of said groups being substituted or unsubstituted.

The invention further relates to a semiconductor or charge transport material, component or device comprising at least one mono-, oligo- or polymer as defined above.

The invention further relates to the use of polymers according to the invention as semiconductors or charge transport materials, in particular in optical, electrooptical or electronic devices, like for example in field effect transistors (FET) as components of integrated circuitry, as thin film transistors in flat panel display applications or for Radio Frequency Identification (RFID) tags, or in semiconducting components for organic light emitting diode (OLED) applications such as electroluminescent displays or backlights of e.g. liquid crystal displays (LCD), for photovoltaic or sensor devices, as electrode materials in batteries, as photoconductors and for electrophotographic applications like electrophotographic recording.

The invention further relates to the use of the novel mono-, oligo- and polymers according to the present invention as electroluminescent materials, in photovoltaic or sensor devices, as electrode materials in batteries, as photoconductors, for electrophotographic applications like electrophotographic recording and as alignment layer in LCD or OLED devices.

The invention further relates to an optical, electrooptical or electronic device, FET, integrated circuit (IC), TFT, OLED or alignment layer comprising a semiconducting or charge transport material, component or device according to the invention.

The invention further relates to a TFT or TFT array for flat panel displays, radio frequency identification (RFID) tag, electroluminescent display or backlight comprising a semiconducting or charge transport material, component or device or a FET, IC, TFT or OLED according to the invention.

The invention further relates to a security marking or device comprising a FET or an RFID tag according to the invention.

DETAILED DESCRIPTION OF THE INVENTION

The mono-, oligo and polymers according to the invention are especially useful as charge transport semiconductors in that they have high carrier mobilities. Particularly preferred are polymers wherein the DTT group is substituted by one or more alkyl or fluoroalkyl groups. The introduction of fluoroalkyl and alkyl side chains into the DTT group improves their solubility and therefore their solution processibility. Furthermore, the presence of fluoroalkyl side chains also renders these materials effective as n-type semiconductors. The electron-withdrawing nature of the fluoroalkyl substituents will also lower the HOMO further and result in a more stable material, which is less susceptible to oxidation.

Dimers, higher oligomers and polymers of unsubstituted DTT display very low solubility. Copolymerisation of DTT with an alkyl or alkoxy functionalised aromatic monomers, e.g. dihexyl, will provide solution processable materials. Variation of the aromatic comonomers provides a method of tailoring the band gap of the polymers. This will lead to better stability and higher charge carrier mobility.

Particularly preferred are mono-, oligo-, and polymers having one or more identical or different recurring units of formula I

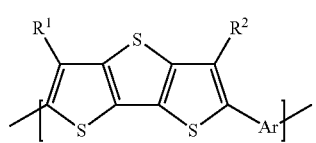

wherein $R^1$ and $R^2$ are independently of each other H, halogen or straight chain, branched or cyclic alkyl with 1 to 20 C-atoms, which may be unsubstituted, mono- or poly-substituted by F, Cl, Br, I and/or CN, it being also possible for one or more non-adjacent $CH_2$ groups to be replaced, in each case independently from one another, by —O—, —S—, —NH—, —NR$^0$—, —SiR$^0$R$^{00}$—, —CO—, —COO—, —OCO—, —OCO—O—, —S—CO—, —CO—S—, —CH=CH— or —C≡C— in such a manner that O and/or S atoms are not linked directly to one another, or optionally substituted aryl or heteroaryl, or P-Sp-, P is a polymerisable or reactive group, Sp is a spacer group or a single bond, $R^0$ and $R^{00}$ are independently of each other H or alkyl with 1 to 12 C-atoms, and Ar is an arylene or heteroarylene group that is optionally substituted with one or more groups $R^1$.

Particularly preferred are mono-, oligo-, and polymers of formula I1

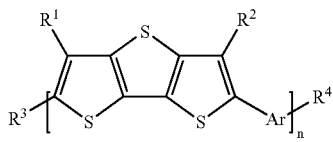

I1 wherein $R^1$, $R^2$, and Ar have independently of each other one of the meanings of formula I, $R^3$ and $R^4$ are independently of each other H, halogen, $Sn(R^0)_3$ or straight chain, branched or cyclic alkyl with 1 to 20 C-atoms, which may be unsubstituted, mono- or poly-substituted by F, Cl, Br, I, —CN and/or —OH, it being also possible for one or more non-adjacent $CH_2$ groups to be replaced, in each case independently from one another, by —O—, —S—, —NH—, —$NR^0$—, —$SiR^0R^{00}$—, —CO—, —COO—, —OCO—, —OCO—O—, —S—CO—, —CO—S—, —CH=CH— or —C≡C— in such a manner that O and/or S atoms are not linked directly to one another, optionally substituted aryl or heteroaryl, or P-Sp, n is an integer from 1 to 10000, and wherein the recurring units may be identical or different.

Especially preferred are mono-, oligo-, and polymers of formula I and I1 having identical recurring units.

Further preferred are mono-, oligo-, and polymers of formula I and I1 wherein $R^1$ and $R^2$ are identical groups.

Especially preferred are mono-, oligo-, and polymers of formula I and I1 having a degree of polymerisation (number n of recurring units) from 2 to 5000, in particular from 10 to 5000, very preferably from 100 to 1000.

Further preferred are mono-, oligo-, and polymers of formula I and I1 having a molecular weight from 5000 to 300000, in particular from 20000 to 100000.

Especially preferred are regioregular polymers of formula I and I1. The regioregularity in these polymers is preferably at least 90%, in particular 95% or more, very preferably 98% or more, most preferably from 99 to 100%.

Regioregular polymers are advantageous as they show strong interchain pi-pi-stacking interactions and a high degree of crystallinity, making them effective charge transport materials with high carrier mobilities.

Further preferred are mono-, oligo- and polymers of formula I and I1 comprising at least one reactive group P that is capable of a polymerisation or crosslinking reaction.

Further preferred are mono-, oligo- and polymers of formula I and I1 that are mesogenic or liquid crystalline, in particular polymers forming calamitic phases, and reactive mesogens of formula I or I1 comprising one or more groups P-Sp-, forming calamitic phases.

Further preferred are mono-, oligo- and polymers as shown above and below wherein Ar is thiophene or a group comprising two or more thiophene fused rings, which in each case is at least monosubstituted by halogen, Ar is different from unsubstituted thiophene or a group comprising two or more unsubstituted fused thiophene rings, Ar is different from thiophene or fused thiophene, n is an integer from 1 to 15 and one or both of $R^3$ and $R^4$ denote P-Sp-, at least one of $R^{1-4}$ denotes P-Sp-, n is an integer from 2 to 5000 and $R^3$ and $R^4$ are different from P-Sp-, $R^1$ and $R^2$ are selected from $C_1$-$C_{20}$-alkyl that is optionally substituted with one or more fluorine atoms, $C_1$-$C_{20}$-alkenyl, $C_1$-$C_{20}$-alkynyl, $C_1$-$C_{20}$-alkoxy, $C_1$-$C_{20}$-thioalkyl, $C_1$-$C_{20}$-silyl, $C_1$-$C_{20}$-ester, $C_1$-$C_{20}$-amino, $C_1$-$C_{20}$-fluoroalkyl, $(CH_2CH_2O)_mC_iH_{2i+1}$ with m being an integer from 1 to 6 and i being 1, 2, or 3, and optionally substituted aryl or heteroaryl, very preferably $C_1$-$C_{20}$-alkyl or $C_1$-$C_{20}$-fluoroalkyl, $R^3$ and $R^4$ are selected from H, halogen, $Sn(R^0)_3$, $CH_2Cl$, COH, CH=$CH_2$, $SiR^0R^{00}$alkyl and optionally substituted aryl or heteroaryl, n>1.

Ar is preferably a mono-, bi- or tricyclic aromatic or heteroaromatic group with up to 25 C atoms, wherein the rings can be fused, and in which the heteroaromatic group contains at least one hetero ring atom, preferably selected from N, O and S. It is optionally substituted with one or more of F, Cl, Br, I, CN, and straight chain, branched or cyclic alkyl having 1 to 20 C atoms, which is unsubstituted, mono- or poly-substituted by F, Cl, Br, I, —CN or —OH, and in which one or more non-adjacent $CH_2$ groups are optionally replaced, in each case independently from one another, by —O—, —S—, —NH—, —$NR^0$—, —$SiR^0R^{00}$—, —CO—, —COO—, OCO—, —OCO—O, —S—CO—, —CO—S—, —CH=CH— or —C≡C— in such a manner that O and/or S atoms are not linked directly to one another.

Preferred groups Ar are selected from phenyl in which, in addition, one or more CH groups may be replaced by N, or naphthalene, fluorene or oxazole, wherein all these groups are optionally mono- or polysubstituted with L, wherein L is F, Cl, Br, or an alkyl, alkoxy, alkylcarbonyl or alkoxycarbonyl group with 1 to 12 C atoms, wherein one or more H atoms are optionally replaced by F or Cl. Further preferred groups Ar are thiophene, thienothiophene and dithienothiophene which are substituted by one or more halogen, in particular fluorine, atoms.

Especially preferred groups Ar are phenyl, fluorinated phenyl, pyridine, pyrimidine, biphenyl, naphthalene, fluorinated thiophene, fluorinated benzo[1,2-b:4,5-b']dithiophene, thiazole and oxazole, all of which are unsubstituted, mono- or polysubstituted with L as defined above.

If one of $R^{1-4}$ is aryl or heteroaryl, it is preferably a mono-, bi- or tricyclic aromatic or heteroaromatic group with up to 25 C atoms, wherein the rings can be fused, and in which the heteroaromatic group contains at least one hetero ring atom, preferably selected from N, O and S. It is optionally substituted with one or more of F, Cl, Br, I, CN, and straight chain, branched or cyclic alkyl having 1 to 20 C atoms, which is unsubstituted, mono- or poly-substituted by F, Cl, Br, I, —CN or —OH, and in which one or more non-adjacent $CH_2$ groups are optionally replaced, in each case independently from one another, by —O—, —S—, —NH—, —$NR^0$—, —$SiR^0R^{00}$—, —CO—, —COO—, OCO—, —OCO—O, —S—CO—, —CO—S—, —CH=CH— or —C≡C— in such a manner that O and/or S atoms are not linked directly to one another.

Especially preferred aryl and heteroaryl groups are phenyl, fluorinated phenyl, pyridine, pyrimidine, biphenyl, naphthalene, fluorinated thiophene, benzo[1,2-b:4,5-b']dithiophene, thiazole and oxazole, all of which are unsubstituted, mono- or polysubstituted with L as defined above.

If one of $R^1$ and $R^2$ is an alkyl or alkoxy radical, i.e. where the terminal $CH_2$ group is replaced by —O—, this may be straight-chain or branched. It is preferably straight-chain, has 2 to 8 carbon atoms and accordingly is preferably ethyl, propyl, butyl, pentyl, hexyl, heptyl, octyl, ethoxy, propoxy, butoxy, pentoxy, hexyloxy, heptoxy, or octoxy, furthermore methyl, nonyl, decyl, undecyl, dodecyl, tridecyl, tetradecyl, pentadecyl, nonoxy, decoxy, undecoxy, dodecoxy, tridecoxy or tetradecoxy, for example.

Oxaalkyl, i.e. where one $CH_2$ group is replaced by —O—, is preferably straight-chain 2-oxapropyl (=methoxymethyl), 2-(=ethoxymethyl) or 3-oxabutyl (=2-methoxyethyl), 2-, 3-, or 4-oxapentyl, 2-, 3-, 4-, or 5-oxahexyl, 2-, 3-, 4-, 5-, or 6-oxaheptyl, 2-, 3-, 4-, 5-, 6- or 7-oxaoctyl, 2-, 3-, 4-, 5-, 6-, 7- or 8-oxanonyl or 2-, 3-, 4-, 5-, 6-,7 -, 8- or 9-oxadecyl, for example.

Fluoroalkyl or fluorinated alkyl or alkoxy is preferably straight chain $(O)C_iF_{2i+1}$, wherein i is an integer from 1 to 20, in particular from 1 to 15, very preferably $(O)CF_3$, $(O)C_2F_5$, $(O)C_3F_7$, $(O)C_4F_9$, $(O)C_5F_{11}$, $(O)C_6F_{13}$, $(O)C_7F_{15}$ or $(O)C_8F_{17}$, most preferably $(O)C_6F_{13}$.

Halogen is preferably F, Br or Cl, very preferably F or Cl, most preferably F.

Hetero atoms are preferably selected from N, O and S.

The polymerisable or reactive group P is preferably selected from $CH_2=CW^1$—COO—,

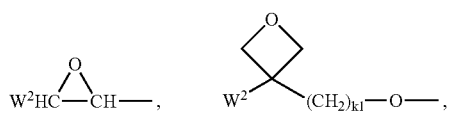

$CH_2=CW^2-(O)_{k1}$—, $CH_3$—CH=CH—O—, $(CH_2=CH)_2$CH—OCO—, $(CH_2=CH)_2$CH—O—, $(CH_2=CH-CH_2)_2$CH—OCO—, $(CH_2=CH-CH_2)_2$CH—O—, $(CH_2=CH-CH_2)_2$N—, $(CH_2=CH-CH_2)_2$N—CO—, HO—$CW^2W^3$—, HS—$CW^2W^3$—, $HW^2$N—, HO—$CW^2W^3$—NH—, $CH_2=CW^1$—CO—NH—, $CH_2=CH-(COO)_{k1}$—Phe-$(O)_{k2}$—, Phe-CH=CH—, HOOC—, OCN—, and $W^4W^5W^6$Si—, with $W^1$ being H, Cl, CN, phenyl or alkyl with 1 to 5 C-atoms, in particular H, Cl or $CH_3$, $W^2$ and $W^3$ being independently of each other H or alkyl with 1 to 5 C-atoms, in particular methyl, ethyl or n-propyl, $W^4$, $W^5$ and $W^6$ being independently of each other Cl, oxaalkyl or oxacarbonylalkyl with 1 to 5 C-atoms, Phe being 1,4-phenylene and $k_1$ and $k_2$ being independently of each other 0 or 1.

Especially preferred groups P are $CH_2=CH$—COO—, $CH_2=C(CH_3)$—COO—, $CH_2=CH$—, $CH_2=CH$—O—, $(CH_2=CH)_2$CH—OCO—, $(CH_2=CH)_2$CH—O—, $(CH_2=CH-CH_2)_2$N—, $(CH_2=CH-CH_2)_2$N—CO— and

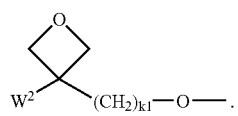

Very preferred are acrylate and oxetane groups. Oxetanes produce less shrinkage upon polymerisation (cross-linking), which results in less stress development within films, leading to higher retention of ordering and fewer defects. Oxetane cross-linking also requires cationic initiator, which unlike free radical initiator is inert to oxygen.

As for the spacer group Sp all groups can be used that are known for this purpose to the skilled in the art. The spacer group Sp is preferably of formula Sp'-X, such that P-Sp- is P-Sp'-X—, wherein Sp' is alkylene with up to 20 C atoms which may be unsubstituted, mono- or poly-substituted by F, Cl, Br, I or CN, it being also possible for one or more non-adjacent $CH_2$ groups to be replaced, in each case independently from one another, by —O—, —S—, —NH—, —$NR^0$—, —$SiR^0R^{00}$—, —CO—, —COO—, —OCO—, —OCO—O—, —S—CO—, —CO—S—, —CH=CH— or —C≡C— in such a manner that O and/or S atoms are not linked directly to one another, X is —O—, —S—, —CO—, —COO—, —OCO—, —O—COO—, —CO—$NR^0$—, —$NR^0$—CO—, —$OCH_2$—, —$CH_2O$—, —$SCH_2$—, —$CH_2S$—, —$CF_2O$—, —$OCF_2$—, —$CF_2S$—, —$SCF_2$—, —$CF_2CH_2$—, —$CH_2CF_2$—, —$CF_2CF_2$—, —CH=N—, —N=CH—, —N=N—, —CH=$CR^0$—, —$CX^1=CX^2$—, —C≡C—, —CH=CH—COO—, —OCO—CH=CH— or a single bond, $X^1$ and $X^2$ are each, independently of each other, H, F, Cl or CN, $R^0$ and $R^{00}$ have one of the meanings given above.

X is preferably —O—, —S—, —$OCH_2$—, —$CH_2O$—, —$SCH_2$—, —$CH_2S$—, —$CF_2O$—, —$OCF_2$—, —$CF_2S$—, —$SCF_2$—, —$CH_2CH_2$—, —$CF_2CH_2$—, —$CH_2CF_2$—, —$CF_2CF_2$—, —CH=N—, —N=CH—, —N=N—, —CH=$CR^0$—, —$CX^1=CX^2$—, —C≡C— or a single bond, in particular —O—, —S—, —C≡C—, —$CX^1=CX^2$— or a single bond, very preferably a group that is able to from a conjugated system, such as —C≡C— or —$CX^1=CX^2$—, or a single bond.

Typical groups Sp' are, for example, —$(CH_2)_p$—, —$(CH_2CH_2O)_q$—$CH_2CH_2$—, —$CH_2CH_2$—S—$CH_2CH_2$— or —$CH_2CH_2$—NH—$CH_2CH_2$— or —$(SiR^0R^{00}$—O$)_p$—, with p being an integer from 2 to 12, q being an integer from 1 to 3 and $R^0$ and $R^{00}$ having the meanings given above.

Preferred groups Sp' are ethylene, propylene, butylene, pentylene, hexylene, heptylene, octylene, nonylene, decylene, undecylene, dodecylene, octadecylene, ethyleneoxyethylene, methyleneoxybutylene, ethylene-thioethylene, ethylene-N-methyl-iminoethylene, 1-methylalkylene, ethenylene, propenylene and butenylene for example.

Further preferred are compounds with one or two groups P-Sp- wherein Sp is a single bond.

In case of compounds with two groups P-Sp, each of the two polymerisable groups P and the two spacer groups Sp can be identical or different.

Side chain liquid crystal polymers or copolymers (SCLCPs) obtained from the inventive compounds or mixtures by polymerisation or copolymerisation have a backbone that is formed by the polymerisable group P.

The mono-, oligo- and polymers of the present invention can be synthesized according to or in analogy to known methods. Some preferred methods are described below.

Unsubstituted DTT:

Two main routes are possible where either the DTT derivative or the aromatic species is an organometallic species. As shown in Scheme 1, using the Stille methodology bis(trialkyl stannyl) DTT (13) can be coupled with a dihalo aromatic compound to yield the required polymer (14). Using the Suzuki methodology the bis boronic ester derivative of DTT (15) can be coupled with a dihalo aromatic compound to yield the required polymer (14).

Scheme 1:

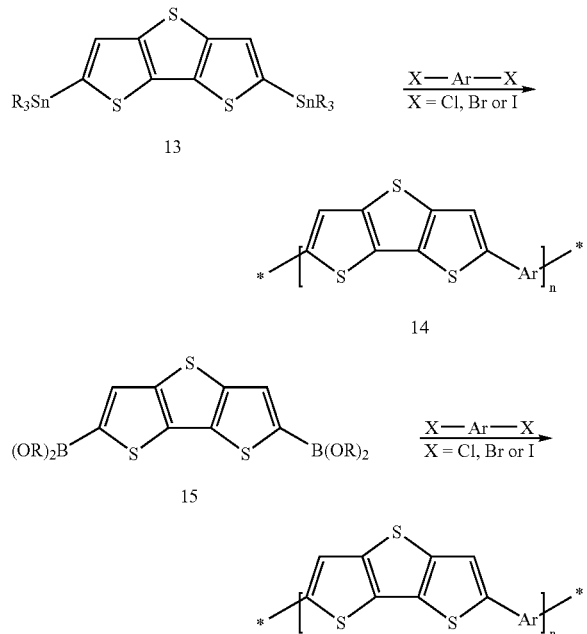

wherein Ar is as defined in formula I and R is an alkyl group.

Alternatively, as shown in Scheme 2, a bis(trialkyl stannyl) aromatic species (17) can be coupled with dibromo DTT (16) to yield the required polymer (14) or using the Suzuki methodology an aromatic bis (boronic ester) (18) can be coupled with dibromo (16) DTT to yield the required polymer (14).

Scheme 2:

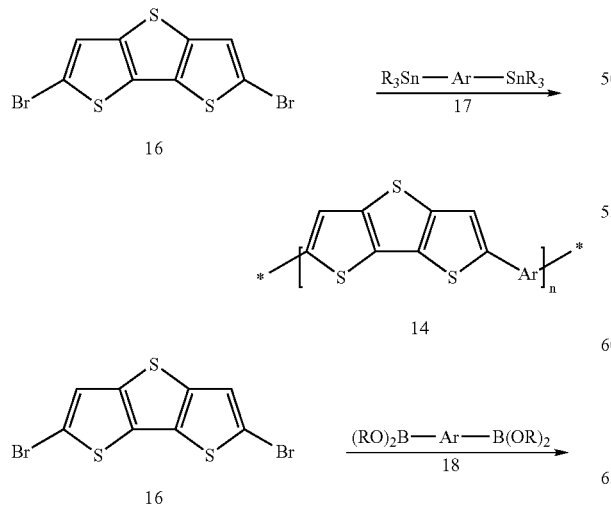

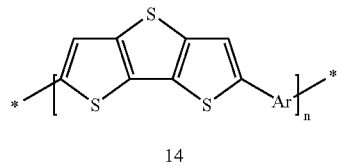

wherein Ar is as defined in formula I and R is an alkyl group.

Substituted DTT:

Copolymerisation of dialkyl DTT with other aromatic species is also possible. The improved solubility of the dialkyl DTT, over the unsubstituted DTT, means that a range of unsubstituted aromatics can be used to synthesise soluble polymers. Alternatively use of substituted aromatics would result in improved molecular weight or solubility. As with the unsubstituted DTT two main routes are possible as shown in Scheme 3 and Scheme 4 below, where either the DTT derivative (Scheme 3) or the aromatic species (Scheme 4) is an organometallic species.

Scheme 3:

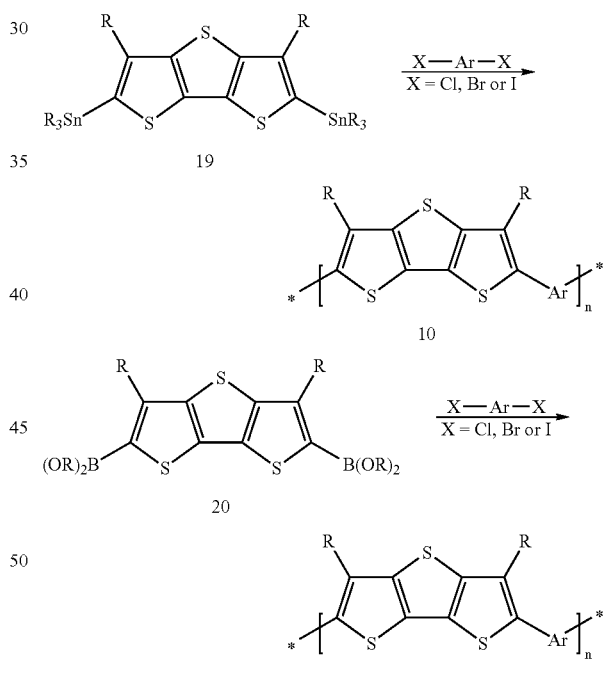

Scheme 4:

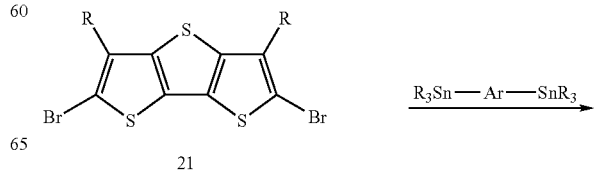

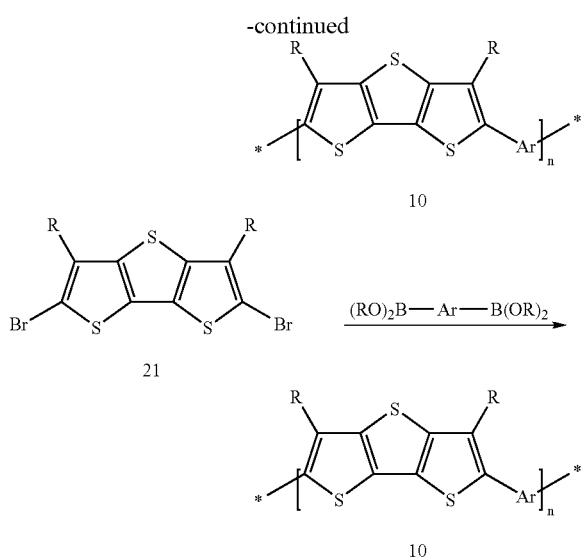

wherein Ar is as defined in formula I and R is an alkyl group.

A further aspect of the invention relates to both the oxidised and reduced form of the compounds and materials according to this invention. Either loss or gain of electrons results in formation of a highly delocalised ionic form, which is of high conductivity. This can occur on exposure to common dopants. Suitable dopants and methods of doping are known to those skilled in the art, e.g., from EP 0 528 662, U.S. Pat. No. 5,198,153 or WO 96/21659.

The doping process typically implies treatment of the semiconductor material with an oxidating or reducing agent in a redox reaction to form delocalised ionic centres in the material, with the corresponding counterions derived from the applied dopants. Suitable doping methods comprise for example exposure to a doping vapor in the atmospheric pressure or at a reduced pressure, electrochemical doping in a solution containing a dopant, bringing a dopant into contact with the semiconductor material to be thermally diffused, and ion-implantantion of the dopant into the semiconductor material.

When electrons are used as carriers, suitable dopants are for example halogens (e.g., $I_2$, $Cl_2$, $Br_2$, ICl, $ICl_3$, IBr and IF), Lewis acids (e.g., $PF_5$, $AsF_5$, $SbF_5$, $BF_3$, $BCl_3$, $SbCl_5$, $BBr_3$ and $SO_3$), protonic acids, organic acids, or amino acids (e.g., HF, HCl, $HNO_3$, $H_2SO_4$, $HClO_4$, $FSO_3H$ and $ClSO_3H$), transition metal compounds (e.g., $FeCl_3$, FeOCl, $Fe(ClO_4)_3$, $Fe(4-CH_3C_6H_4SO_3)_3$, $TiCl_4$, $ZrCl_4$, $HfCl_4$ $NbF_5$, $NbCl_5$, $TaCl_5$, $MoF_5$, $MoCl_5$, $WF_5$, $WCl_6$, $UF_6$ and $LnCl_3$ (wherein Ln is a lanthanoid), anions (e.g., $Cl^-$, $Br^-$, $I^-$, $I_3^-$, $HSO_4^-$, $SO_4^{2-}$, $NO_3^-$, $ClO_4^-$, $BF_4^-$, $PF_6^-$, $AsF_6^-$, $SbF_6^-$, $FeCl_4^-$, $Fe(CN)_6^{3-}$, and anions of various sulfonic acids, such as aryl-$SO_3^-$). When holes are used as carriers, examples of dopants are cations (e.g., $H^+$, $Li^+$, $Na^+$, $K^+$, $Rb^+$ and $Cs^+$), alkali metals (e.g., Li, Na, K, Rb, and Cs), alkaline-earth metals (e.g., Ca, Sr, and Ba), $O_2$, $XeOF_4$, ($NO_2^+$) ($SbF_6^-$), ($NO_2^+$) ($SbCl_6^-$), ($NO_2^+$) ($BF_4^-$), $AgClO_4$, $H_2IrCl_6$, $La(NO_3)_3$ $6H_2O$, $FSO_2OOSO_2F$, Eu, acetylcholine, $R_4N^+$, (R is an alkyl group), $R_4P^+$(R is an alkyl group), $R_6As^+$(R is an alkyl group), and $R_3S^+$(R is an alkyl group).

The conducting form of the compounds and materials of the present invention can be used as an organic "metal" in applications, for example, but not limited to, charge injection layers and ITO planarising layers in organic light emitting diode applications, films for flat panel displays and touch screens, antistatic films, printed conductive substrates, patterns or tracts in electronic applications such as printed circuit boards and condensers.

A preferred embodiment of the present invention relates to mono-, oligo- and polymers of formula I and its preferred subformulae that are mesogenic or liquid crystalline, and very preferably comprise one or more polymerisable groups. Very preferred materials of this type are monomers and oligomers of formula I and its preferred subformulae wherein n is an integer from 1 to 15 and $R^3$ and/or $R^4$ denote P-Sp-.

These materials are particularly useful as semiconductors or charge transport materials, as they can be aligned into uniform highly ordered orientation in their liquid crystal phase by known techniques, thus exhibiting a higher degree of order that leads to particularly high charge carrier mobility. The highly ordered liquid crystal state can be fixed by in situ polymerisation or crosslinking via the groups P to yield polymer films with high charge carrier mobility and high thermal, mechanical and chemical stability.

For example, if a device is made from a polymerisable liquid crystal material by polymerisation in situ, the liquid crystal material preferably comprises one or more mono- or oligomers of formula I and its preferred subformulae wherein one or both of $R^3$ and $R^4$ denote P-Sp-. If a liquid crystal polymer is preapred first, for example by polymerisation in solution, and the isolated polymer is used to make the device, the polymer is preferably made from a liquid crystal material comprising one or more mono- or oligomers of formula I and its preferred subformulae wherein one of $R^3$ and $R^4$ denotes P-Sp-.

It is also possible to copolymerise the polymerisable mono-, oligo- and polymers according to the present invention with other polymerisable mesogenic or liquid crystal monomers that are known from prior art, in order to induce or enhance liquid crystal phase behaviour.

Thus, another aspect of the invention relates to a polymerisable liquid crystal material comprising one or more mono-, oligo- or polymers of the present invention as described above and below comprising at least one polymerisable group, and optionally comprising one or more further polymerisable compounds, wherein at least one of the polymerisable mono-, oligo- and polymers of the present invention and/or the further polymerisable compounds is mesogenic or liquid crystalline.

Particularly preferred are liquid crystal materials having a nematic and/or smectic phase. For FET applications smectic materials are especially preferred. For OLED applications nematic or smectic materials are especially preferred.

Another aspect of the present invention relates to an anisotropic polymer film with charge transport properties obtainable from a polymerisable liquid crystal material as defined above that is aligned in its liquid crystal phase into macroscopically uniform orientation and polymerised or crosslinked to fix the oriented state.

Preferably polymerisation is carried out as in-situ polymerisation of a coated layer of the material, preferably during fabrication of the electronic or optical device comprising the inventive semiconductor material. In case of liquid crystal materials, these are preferably aligned in their liquid crystal state into homeotropic orientation prior to polymerisation, where the conjugated pi-electron systems are orthogonal to the direction of charge transport. This ensures that the intermolecular distances are minimised and hence then energy required to transport charge between molecules is minimised. The molecules are then polymerised or crosslinked to fix the uniform orientation of the liquid crystal state. Alignment and curing are carried out in the liquid crystal phase or mesophase of the material. This technique is known in the art and is generally described for example in D. J. Broer, et al., Angew. Makromol. Chem. 183, (1990), 45-66

Alignment of the liquid crystal material can be achieved for example by treatment of the substrate onto which the material is coated, by shearing the material during or after coating, by application of a magnetic or electric field to the coated material, or by the addition of surface-active compounds to the liquid crystal material. Reviews of alignment techniques are given for example by I. Sage in "Thermotropic Liquid Crystals", edited by G. W. Gray, John Wiley & Sons, 1987, pages 75-77, and by T. Uchida and H. Seki in "Liquid Crystals—Applications and Uses Vol. 3", edited by B. Bahadur, World Scientific Publishing, Singapore 1992, pages 1-63. A review of alignment materials and techniques is given by J. Cognard, Mol. Cryst. Liq. Cryst. 78, Supplement 1 (1981), pages 1-77.

Polymerisation takes place by exposure to heat or actinic radiation. Actinic radiation means irradiation with light, like UV light, IR light or visible light, irradiation with X-rays or gamma rays or irradiation with high energy particles, such as ions or electrons. Preferably polymerisation is carried out by UV irradiation at a non-absorbing wavelength. As a source for actinic radiation for example a single UV lamp or a set of UV lamps can be used. When using a high lamp power the curing time can be reduced. Another possible source for actinic radiation is a laser, like e.g. a UV laser, an IR laser or a visible laser.

Polymerisation is preferably carried out in the presence of an initiator absorbing at the wavelength of the actinic radiation. For example, when polymerising by means of UV light, a photoinitiator can be used that decomposes under UV irradiation to produce free radicals or ions that start the polymerisation reaction. When curing polymerisable materials with acrylate or methacrylate groups, preferably a radical photoinitiator is used, when curing polymerisable materials with vinyl, epoxide and oxetane groups, preferably a cationic photoinitiator is used. It is also possible to use a polymerisation initiator that decomposes when heated to produce free radicals or ions that start the polymerisation. As a photoinitiator for radical polymerisation for example the commercially available Irgacure 651, Irgacure 184, Darocure 1173 or Darocure 4205 (all from Ciba Geigy AG) can be used, whereas in case of cationic photopolymerisation the commercially available UVI 6974 (Union Carbide) can be used.

The polymerisable material can additionally comprise one or more other suitable components such as, for example, catalysts, sensitizers, stabilizers, inhibitors, chain-transfer agents, co-reacting monomers, surface-active compounds, lubricating agents, wetting agents, dispersing agents, hydrophobing agents, adhesive agents, flow improvers, defoaming agents, deaerators, diluents, reactive diluents, auxiliaries, colourants, dyes or pigments.

Mono-, oligo- and polymers comprising one or more groups P-Sp- can also be copolymerised with polymerisable mesogenic compounds to induce or enhance liquid crystal phase behaviour. Polymerisable mesogenic compounds that are suitable as comonomers are known in prior art and disclosed for example in WO 93/22397; EP 0,261,712; DE 195,04,224; WO 95/22586 and WO 97/00600.

Another aspect of the invention relates to a liquid crystal side chain polymer (SCLCP) obtained from a polymerisable liquid crystal material as defined above by polymerisation or polymeranaloguous reaction. Particularly preferred are SCLCPs obtained from one or more monomers of formula I1 and its preferred subformulae wherein one or both, preferably one, of $R^3$ and $R^4$ are a polymerisable or reactive group, or from a polymerisable mixture comprising one or more of said monomers.

Another aspect of the invention relates to an SCLCP obtained from one or more monomers of formula I1 and its preferred subformulae wherein one or both of $R^3$ and $R^4$ are a polymerisable group, or from a polymerisable liquid crystal mixture as defined above, by copolymerisation or polymeranaloguous reaction together with one or more additional mesogenic or non-mesogenic comonomers.

Side chain liquid crystal polymers or copolymers (SCLCPs), in which the semiconducting component is located as a pendant group, separated from a flexible backbone by an aliphatic spacer group, offer the possibility to obtain a highly ordered lamellar like morphology. This structure consists of closely packed conjugated aromatic mesogens, in which very close (typically <4 Å) pi-pi stacking can occur. This stacking allows intermolecular charge transport to occur more easily, leading to high charge carrier mobilities. SCLCPs are advantageous for specific applications as they can be readily synthesized before processing and then e.g. be processed from solution in an organic solvent. If SCLCPs are used in solutions, they can orient spontaneously when coated onto an appropriate surface and when at their mesophase temperature, which can result in large area, highly ordered domains.

SCLCPs can be prepared from the polymerisable compounds or mixtures according to the invention by the methods described above, or by conventional polymerisation techniques which are known to those skilled in the art, including for example radicalic, anionic or cationic chain polymerisation, polyaddition or polycondensation. Polymerisation can be carried out for example as polymerisation in solution, without the need of coating and prior alignment, or polymerisation in situ. It is also possible to form SCLCPs by grafting compounds according to the invention with a suitable reactive group, or mixtures thereof, to presynthesized isotropic or anisotropic polymer backbones in a polymeranaloguous reaction. For example, compounds with a terminal hydroxy group can be attached to polymer backbones with lateral carboxylic acid or ester groups, compounds with terminal isocyanate groups can be added to backbones with free hydroxy groups, compounds with terminal vinyl or vinyloxy groups can be added, e.g., to polysiloxane backbones with Si—H groups. It is also possible to form SCLCPs by copolymerisation or polymeranaloguous reaction from the inventive compounds together with conventional mesogenic or non mesogenic comonomers. Suitable comonomers are known to those skilled in the art. In principle it is possible to use all conventional comonomers known in the art that carry a reactive or polymerisable group capable of undergoing the desired polymer-forming reaction, like for example a polymerisable or reactive group P as defined above. Typical mesogenic comonomers are for example those mentioned in WO 93/22397, EP 0 261 712, DE 195 04 224, WO 95/22586, WO 97/00600 and GB 2 351 734. Typical non mesogenic comonomers are for example alkyl acrylates or alkyl methacrylates with alkyl groups of 1 to 20 C atoms, like methyl acrylate or methyl methacrylate.

The mono-, oligo- and polymers of the present invention are useful as optical, electronic and semiconductor materials, in particular as charge transport materials in field effect transistors (FETs), e.g., as components of integrated circuitry, ID tags or TFT applications. Alternatively, they may be used in organic light emitting diodes (OLEDs) in electroluminescent display applications or as backlight of, e.g., liquid crystal displays, as photovoltaics or sensor materials, for electrophotographic recording, and for other semiconductor applications.

Especially the oligomers and polymers according to the invention show advantageous solubility properties which allow production processes using solutions of these compounds. Thus films, including layers and coatings, may be generated by low cost production techniques, e.g., spin coating. Suitable solvents or solvent mixtures comprise alkanes and/or aromatics, especially their fluorinated derivatives.

The materials of the present invention are useful as optical, electronic and semiconductor materials, in particular as charge transport materials in field effect transistors (FETs), as photovoltaics or sensor materials, for electrophotographic recording, and for other semiconductor applications. Such FETs, where an organic semiconductive material is arranged as a film between a gate-dielectric and a drain and a source electrode, are generally known, e.g., from U.S. Pat. No. 5,892,244, WO 00/79617, U.S. Pat. No. 5,998,804, and from the references cited in the background and prior art chapter and listed below. Due to the advantages, like low cost production using the solubility properties of the compounds according to the invention and thus the processibility of large surfaces, preferred applications of these FETs are such as integrated circuitry, TFT-displays and security applications.

In security applications, field effect transistors and other devices with semiconductive materials, like transistors or diodes, may be used for ID tags or security markings to authenticate and prevent counterfeiting of documents of value like banknotes, credit cards or ID cards, national ID documents, licenses or any product with monetry value, like stamps, tickets, shares, cheques etc.

Alternatively, the mono-, oligo- and polymers according to the invention may be used in organic light emitting devices or diodes (OLEDs), e.g., in display applications or as backlight of e.g. liquid crystal displays. Common OLEDs are realized using multilayer structures. An emission layer is generally sandwiched between one or more electron-transport and/or hole-transport layers. By applying an electric voltage electrons and holes as charge carriers move towards the emission layer where their recombination leads to the excitation and hence luminescence of the lumophor units contained in the emission layer. The inventive compounds, materials and films may be employed in one or more of the charge transport layers and/or in the emission layer, corresponding to their electrical and/or optical properties. Furthermore their use within the emission layer is especially advantageous, if the compounds, materials and films according to the invention show electroluminescent properties themselves or comprise electroluminescent groups or compounds. The selection, characterization as well as the processing of suitable monomeric, oligomeric and polymeric compounds or materials for the use in OLEDs is generally known by a person skilled in the art, see, e.g., Meerholz, Synthetic Materials, 111-112, 2000, 31-34, Alcala, J. Appl. Phys., 88, 2000, 7124-7128 and the literature cited therein.

According to another use, the inventive compounds, materials or films, especially those which show photoluminescent properties, may be employed as materials of light sources, e.g., of display devices such as described in EP 0 889 350 A1 or by C. Weder et al., Science, 279, 1998, 835-837.

According to another use, the inventive compounds, materials or films can be used alone or together with other materials in or as alignment layers in LCD or OLED devices, as described for example in US 2003/0021913. The use of charge transport compounds according to the present invention can increase the electrical conductivity of the alignment layer. When used in an LCD, this increased electrical conductivity can reduce adverse residual dc effects in the switchable LCD cell and suppress image sticking or, for example in ferroelectric LCDs, reduce the residual charge produced by the switching of the spontaneous polarisation charge of the ferroelectric LCs. When used in an OLED device comprising a light emitting material provided onto the alignment layer, this increased electrical conductivity can enhance the electroluminescence of the light emitting material. The compounds or materials according to the present invention having mesogenic or liquid crystalline properties can form oriented anisotropic films as described above, which are especially useful as alignment layers to induce or enhance alignment in a liquid crystal medium provided onto said anisotropic film. The materials according to the present invention may also be combined with photoisomerisable compounds and/or chromophores for use in or as photoalignment layers, as described in US 2003/0021913.

The entire disclosure of all applications, patents and publications, cited above and below, and of corresponding European Application No. 03010952.4, filed May 16, 2003 is hereby incorporated by reference.

From the foregoing description, one skilled in the art can easily ascertain the essential characteristics of this invention and, without departing from the spirit and scope thereof, can make various changes and modifications of the invention to adapt it to various usages and conditions.

REFERENCES

1. H. E. Katz, Z. Bao and S. L. Gilat, *Acc. Chem. Res.*, 2001, 34, 5, 359.
2. Sirringhaus, R. H. Friend, X. C. Li, S. C. Moratti, A. B. Holmes and N. Feeder, *Appl. Phys. Lett.*, 1997, 71, 26, 3871.
3. X. C. Li, H. Sirringhaus, F. Garnier, A. B. Holmes, S. C. Moratti, N. Feeder, W. Clegg, S. J. Teat and R. H. Friend, *J. Am. Chem. Soc.*, 1998, 120, 2206
4. J. J. Morrison, M. M. Murray, X. C. Li, A. B. Holmes, S. C. Moratti, R. H. Friend and H. Sirringhaus, *Synth. Met.*, 1999, 102, 987.
5. Arbizzani, C.; Catellani, M.; Mastragostino, M.; Cerroni, M. G. *Journal of Electroanalytical Chemistry* 1997, 423, 23-28.
6. Quattrochi, C.; Lazzaroni, R.; Brédas, J. I.; Zamboni, R.; C, T. *Macromolecules* 1993, 26, 1260-1264.
7. Campos, M.; Casalbore-Miceli, G.; Camaioni, N. *Journal of Physics D: Applied Physics* 1995, 28, 2123-2127.
8. Cervani, R.; Holmes, A. B.; Moratti, S. C.; Köhler, A.; Friend, R. H. *Synthetic Metals* 1996, 76, 169-171.
9. Koβmehl, G.; Belmling, P.; Manecke, G. *Makromolekulare Chemie* 1982, 183, 2771-2786.
10. WO 99/12989.
11. Fuchigami, H.; Tsumura, A.; H, K. *Applied Physics Letters* 1993, 63, 1372-1374.

What is claimed is:

1. An oligomeric or polymeric compound comprising recurring units wherein each recurring unit comprises:
   at least one substituted or unsubstituted dithienothiophene group; and at least one arylene or heteroarylene group, which in each case is substituted or unsubstituted;
wherein the number of recurring units is 10 to 10000.

2. A compound according to claim 1, wherein said at least one arylene or heteroarylene group is thiophene which is at least monosubstituted by halogen, or is a group comprising two or more fused thiophene rings which is at least monosubstituted by halogen.

3. A compound according to claim 1 with a degree of polymerisation from 10 to 5000.

4. A compound according to claim 1, wherein said recurring units of said compound comprise identical or different recurring units of formula I

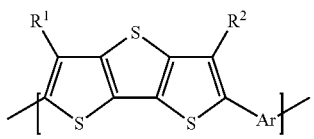

wherein
$R^1$ and $R^2$ are independently of each other H, halogen, optionally substituted aryl, optionally substituted heteroaryl, P-Sp-, or straight chain, branched or cyclic alkyl with 1 to 20 C-atoms, which is unsubstituted, mono- or poly-substituted by F, Cl, Br, I or CN, wherein one or more non-adjacent $CH_2$ are optionally replaced, in each case independently from one another, by —O—, —S—, —NH—, —$NR^0$—, —$SiR^0R^{00}$—, —CO—, —COO—, —OCO—, —OCO—O—, —S—CO—, —CO—S—, —CH=CH— or —C≡C— in such a manner that O and/or S atoms are not linked directly to one another,
P is a polymerisable or reactive group,
Sp is a spacer group or a single bond,
$R^0$ and $R^{00}$ are independently of each other H or alkyl with 1 to 12 C-atoms, and
Ar is an arylene or heteroarylene group, which in each case is unsubstituted or substituted by H, halogen, optionally substituted aryl, optionally substituted heteroaryl, P-Sp-, or straight chain, branched or cyclic alkyl with 1 to 20 C-atoms, which is unsubstituted, mono- or poly-substituted by F, Cl, Br, I or CN, wherein one or more non-adjacent $CH_2$ are optionally replaced, in each case independently from one another, by —O—, —S—, —NH—, —$NR^0$—, —$SiR^0R^{00}$—, —CO—, —COO—, —OCO—, —OCO—O—, —S—CO—, —CO—S—, —CH=CH— or —C≡C— in such a manner that O and/or S atoms are not linked directly to one another.

5. A compound according to claim 4, wherein
$R^1$ and $R^2$ are independently of each other H, halogen, P-Sp-, straight chain, branched or cyclic alkyl with 1 to 20 C-atoms, which is unsubstituted, mono- or poly-substituted by F, Cl, Br, I or CN, wherein one or more non-adjacent $CH_2$ are optionally replaced, in each case independently from one another, by —O—, —S—, —NH—, —$NR^0$—, —$SiR^0R^{00}$—, —CO—, —COO—, —OCO—, —OCO—O—, —S—CO—, —CO—S—, —CH=CH— or —C≡C— in such a manner that O and/or S atoms are not linked directly to one another, or a mono-, bi- or tricyclic aromatic or heteroaromatic group with up to 25 C atoms, wherein the rings can be fused, and in which the heteroaromatic group contains at least one hetero ring atom selected from N, O and S, and said aromatic or heteroaromatic group is unsubstituted or optionally substituted with one or more of F, Cl, Br, I, CN, and straight chain, branched or cyclic alkyl having 1 to 20 C atoms, which is unsubstituted, mono- or poly-substituted by F, Cl, Br, I, —CN or —OH, and in which one or more non-adjacent $CH^2$ groups are optionally replaced, in each case independently from one another, by —O—, —S—, —NH—, —$NR^0$—, —$SiR^0R^{00}$—, —CO—, —COO—, —OCO—, —OCO—O—, —S—CO—, —CO—S—, —CH=CH— or —C≡C— in such a manner that O and/or S atoms are not linked directly to one another;
P is $CH_2=CW^1$—COO—,

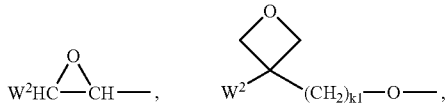

$CH_2=CW^2$—$(O)_{k1}$—, $CH_3$—CH=CH—O—, $(CH_2=CH)_2CH$—OCO—, $(CH_2=CH)_2CH$—O—, $(CH_2=CH$—$CH_2)_2CH$—OCO—, $(CH_2=CH$—$CH_2)_2$N—, $(CH_2=CH$—$CH_2)_2N$—CO—, HO—$CW^2W^3$—, HS—$CW^2W^3$—, $HW^2N$—, HO—$CW^2W^3$—NH—, $CH^2=CW^1$—CO—NH—, $CH_2=CH$—$(COO)_{k1}$—Phe-$(O)_{k2}$—, Phe-CH=CH—, HOOC—, OCN—, or $W^4W^5W^6Si$—;
$W^1$ is H, Cl, CN, phenyl or alkyl having 1 to 5 C-atoms;
$W^2$ and $W^3$ are each independently of each other H or alkyl with 1 to 5 C-atoms;
$W^4$, $W^5$ and $W^6$ are each independently of each other Cl, oxaalkyl or oxacarbonylalkyl with 1 to 5 C-atoms;
Phe is 1,4-phenylene;
$k_1$ and $k_2$ are each independently of each other 0 or 1;
Sp is of the formula Sp'-X;
Sp' is alkylene with up to 20 C atoms which is unsubstituted or mono- or poly-substituted by F, Cl, Br, I or CN, and wherein one or more, non-adjacent $CH_2$ groups are optionally replaced, in each case independently from one another, by —O—, —S—, —NH—, —$NR^0$—, —$SiR^0R^{00}$—, —CO—, —COO—, —OCO—, —OCO—O—, —S—CO—, —CO—S—, —CH=CH— or —C≡C— in such a manner that O and/or S atoms are not linked directly to one another,
X is —O—, —S—, —CO—, —COO—, —OCO—, —O—COO—, —CO—$NR^0$—, —$NR^0$—CO—, —$OCH_2$—, —$CH_2O$—, —$SCH_2$—, —$CH_2S$—, —$CF_2O$—, —$OCF_2$—, —$CF_2S$—, —$SCF_2$—, —$CF_2CH_2$—, —$CH_2CF_2$—, —$CF_2CF_2$—, —CH=N—, —N=CH—, —N=N—, —$CH=CR^0$—, —$CX^1=CX^2$—, —C≡C—, —CH=CH—COO—, —OCO—CH=CH— or a single bond; and
$X^1$ and $X^2$ are independently of each other, H, F, Cl or CN.

6. A compound according to claim 4, wherein the number of recurring units is 10 to 5000.

7. A compound according to claim 4, wherein the number of recurring units is 100 to 1000.

8. A compound according to claim 4, wherein
Ar is phenyl, phenyl in which one or more CH groups are replaced by N, naphthalene, alkyl fluorene or oxazole, which in each case unsubstituted or mono- or polysubstituted by L, wherein L is F, Cl, Br, or an alkyl, alkoxy, alkylcarbonyl or alkoxycarbonyl group with 1 to 12 C atoms, wherein one or more H atoms are optionally replaced by F or Cl, or Ar is thiophene, thienothiophene or dithienothiophene which in each case is substituted by one or more halogen atoms.

9. A compound according to claim 4, wherein $R^1$ and $R^2$ are each independently $C_1$-$C_{20}$-alkyl which is unsubstituted or substituted with one or more fluorine atoms, $C_1$-$C_{20}$-alkenyl, $C_1$-$C_{20}$-alkynyl, $C_1$-$C_{20}$-alkoxy, $C_1$-$C_{20}$-thioether, $C_1$-$C_{20}$-silyl, $C_1$-$C_{20}$-ester, $C_1$-$C_{20}$-amino, $C_1$-$C_{20}$-fluoroalkyl, $(CH_2CH_2O)_m C_i H_{2i+1}$ with m being an integer from 1 to 6 and i being 1, 2, or 3, optionally substituted aryl, or optionally substituted heteroaryl.

10. A compound according to claim 4, wherein said compound is of formula I1

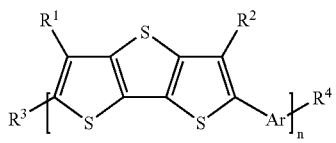

I1 wherein $R^3$ and $R^4$ are independently of each other H, halogen, optionally substituted aryl, optionally substituted heteroaryl, P-Sp-, or straight chain, branched or cyclic alkyl with 1 to 20 C-atoms, which is unsubstituted, mono- or poly-substituted by F, Cl, Br, I or CN, wherein one or more non-adjacent $CH_2$ are optionally replaced, in each case independently from one another, by —O—, —S—, —NH—, —$NR^0$—, —$SiR^0R^{00}$—, —CO—, —COO—, —OCO—, —OCO—O—, —S—CO—, —CO—S—, —CH=CH— or —C≡C— in such a manner that O and/or S atoms are not linked directly to one another, n is an integer from 10 to 10000, and wherein the recurring units may be identical or different.

11. A compound according to claim 10, wherein
$R^1$, $R^2$, $R^3$ and $R^4$ are independently of each other H, halogen, P-Sp-, straight chain, branched or cyclic alkyl with 1 to 20 C-atoms, which is unsubstituted, mono- or poly-substituted by F, Cl, Br, I or CN, wherein one or more non-adjacent $CH_2$ are optionally replaced, in each case independently from one another, by —O—, —S—, —NH—, —$NR^0$—, —$SiR^0R^{00}$—, —CO—, —COO—, —OCO—, —OCO—O—, —S—CO—, —CO—S—, —CH=CH— or —C≡C— in such a manner that O and/or S atoms are not linked directly to one another, or a mono-, bi- or tricyclic aromatic or heteroaromatic group with up to 25 C atoms, wherein the rings can be fused, and in which the heteroaromatic group contains at least one hetero ring atom selected from N, O and S, and said aromatic or heteroaromatic group is unsubstituted or optionally substituted with one or more of F, Cl, Br, I, CN, and straight chain, branched or cyclic alkyl having 1 to [20] C atoms, which is unsubstituted, mono- or poly-substituted by F, Cl, Br, I, —CN or —OH, and in which one or more non-adjacent $CH_2$ groups are optionally replaced, in each case independently from one another, by —O—, —S—, —NH—, —$NR^0$—, —$SiR^0R^{00}$—, —CO—, —COO—, —OCO—, —OCO—O—, —S—CO—, —CO—S—, —CH=CH— or —C≡C— in such a manner that O and/or S atoms are not linked directly to one another;

P is $CH_2=CW^1$—COO—,

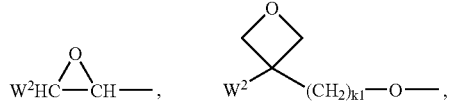

$CH_2=CW^2$—$(O)_{k1}$—, $CH_3$—CH=CH—O—, $(CH_2=CH)^2CH$—OCO—, $(CH_2=CH)^2CH$—O—, $(CH_2=CH$—$CH_2)_2CH$—OCO—, $(CH_2=CH$—$CH_2)_2$N—, $(CH_2=CH$—$CH_2)_2N$—CO—, HO—$CW^2W^3$—, HS—$CW^2W^3$—, $HW^2N$—, HO—$CW^2W^3$—NH—, $CH_2=CW^1$—CO—NH—, $CH_2=CH$—$(COO)_{k1}$—Phe-$(O)_{k2}$—, Phe-CH=CH—, HOOC—, OCN—, or $W^4W^5W^6Si$—;

$W^1$ is H, Cl, CN, phenyl or alkyl having 1 to 5 C-atoms;

$W^2$ and $W^3$ are each independently of each other H or alkyl with 1 to 5 C-atoms;

$W^4$, $W^5$ and $W^6$ are each independently of each other Cl, oxaalkyl or oxacarbonylalkyl with 1 to 5 C-atoms;

Phe is 1,4-phenylene;

$k_1$ and $k_2$ are each independently of each other 0 or 1;

Sp is of the formula Sp'-X;

Sp' is alkylene with up to 20 C atoms which is unsubstituted or mono- or poly-substituted by F, Cl, Br, I or CN, and wherein one or more non-adjacent $CH_2$ groups are optionally replaced, in each case independently from one another, by —O—, —S—, —NH—, —, —$NR^0$—, —$SiR^0R^{00}$—, —CO—, —COO—, —OCO—, —OCO—O—, —S—CO—, —CO—S—, —CH=CH— or —C≡C— in such a manner that O and/or S atoms are not linked directly to one another, X is —O—, —S—, —CO—, —COO—, —OCO—, —COO—, —CO—$NR^0$—, —$NR^0$—CO—, —$OCH_2$—, —$CH_2O$—, —$SCH_2$—, —$CH_2S$—, —$CF_2O$—, —$OCF_2$—, —$CF_2S$—, —$SCF_2$—, —$CF_2CH_2$—, —$CH_2CF_2$—, —$CF_2CF_2$—, —CH=N—, —N=CH—, —N=N—, —CH=$CR^0$—, —$CX^1$=$CX^2$—, —C≡C—, —CH=CH—COO—, —OCO—CH=CH— or a single bond; and $X^1$ and $X^2$ are independently of each other, H, F, Cl or CN.

12. A compound according to claim 10, wherein n is 10-15 and one or both of $R^3$ and $R^4$ denote P-Sp-.

13. A compound according claim 10, wherein, wherein $R^3$ and $R^4$ are each independently H, halogen, $Sn(R^0)_3$, $CH_2Cl$, COH, CH=$CH_2$,$SiR^0R^{00}$, optionally substituted aryl, or optionally substituted heteroaryl.

14. A compound according to claim 10, wherein n is 10 to 5000.

15. A compound according to claim 10, wherein n is 100 to 1000.

16. A polymerisable liquid crystal material comprising one or more polymerisable compounds according to claim 1 comprising at least one polymerisable group, and optionally comprising one or more further polymerisable compounds, wherein said at least one of the polymerisable compounds and/or said one or more further polymerisable compounds is mesogenic or liquid crystalline.

17. An anisotropic polymer film with charge transport properties obtainable by polymerizing a polymerisable liquid crystal material according to claim 16 that is aligned in its liquid crystal phase into macroscopically uniform orientation and polymerised or crosslinked to fix the oriented state.

18. A side chain liquid crystal polymer obtained by: polymerisation of one or more oligomers according to claim 1, or grafting one or more oligomers according to claim 1 to a polymer backbone in a polymeranalogous reaction, in each case, optionally with one or more additional mesogenic or non-mesogenic comonomers.

19. An electroluminescent material, a photovoltaic or sensor device, an electrode material in a battery, a photoconductor, an electrophotographic material in an electrophotographic recording, or an alignment layer in a LCD or an OLED device, comprising a an oligomeric or polymeric compound according to claim 1.

20. An optical, electrooptical or electronic device, an FET, an integrated circuit (IC), a TFT, an OLED or an alignment layer comprising a an oligomeric or polymeric compound according to claim 1.

21. A TFT or TFT array for a flat panel display, a radio frequency identification (RFID) tag, an electroluminescent display or a backlight, comprising a an oligomeric or polymeric compound according to claim 1.

22. A security marking or device comprising a FET, in turn comprising a an oligomeric or polymeric compound according to claim 1.

23. A monomeric, an oligomeric or a polymeric compound according to claim 1, which is oxidatively or reductively doped to form a conducting ionic species.

24. A charge injection layer, a planarising layer, an antistatic film or a conducting substrate or pattern for electronic application or a flat panel display, comprising a an oligomeric or polymeric compound according to claim 23.

25. A security marking or device comprising an RFID tag, in turn comprising a an oligomeric or polymeric compound according to claim 1.

26. A semiconductor or charge transport material, comprising a an oligomeric or polymeric compound according to claim 1.

27. An optical, an electrooptical or an electronic device, or a field effect transistor comprising a semiconductor or a charge transport material according to claim 26.

28. An integrated circuit, a thin film transistor for a flat panel display application, a radio frequency identification tag, or a semiconducting component for an organic light emitting diode, comprising both the charge transport and electroluminescent layer in an electroluminescent display or a backlight of a liquid crystal display, comprising an optical, an electrooptical, or an electronic device, or a field effect transistor according to claim 27.

* * * * *

UNITED STATES PATENT AND TRADEMARK OFFICE
CERTIFICATE OF CORRECTION

PATENT NO.       : 7,244,809 B2  
APPLICATION NO.  : 10/844443  
DATED            : July 17, 2007  
INVENTOR(S)      : Mark Giles et al.

Page 1 of 1

It is certified that error appears in the above-identified patent and that said Letters Patent is hereby corrected as shown below:

Column 18, line 8 reads "$CH^2$" should read -- $CH_2$ --  
Column 18, line 35 reads "$W^{4,}W^5$" should read -- $W^4$, $W^5$ --  
Column 18, line 42 reads "one or more, non-adjacent" should read -- one or more non-adjacent --  
Column 18, line 66 reads "case unsubstituted" should read -- case is unsubstituted --  
Column 19, line 61 reads "1 to $^{20}$ C atoms" should read -- 1 to 20 C atoms --  
Column 20, line 14 reads "$CH)^2CH—OCO—, (CH_2=CH)^2CH$" should read -- $CH)_2CH—OCO—, (CH_2=CH)_2CH$ --  
Column 20, line 39 reads "—COO—" should read -- —O—COO --  
Column 20, line 44 reads "—CH=CR°—" should read -- —CH=CR⁰— --  
Column 20, line 52 reads "$CH_2,Si$" should read -- $CH_2$, Si --  
Column 21, line 6 start new line after "1, or"  
Column 21, line 14 reads "comprising a an" should read -- comprising an --  
Column 21, line 18 reads "comprising a an" should read -- comprising an --  
Column 21, line 22 reads "comprising a an" should read -- comprising an --  
Column 21, line 25 reads "comprising a an" should read -- comprising an --  
Column 22, line 6 reads "comprising a an" should read -- comprising an --  
Column 22, line 9 reads "comprising a an" should read -- comprising an --  
Column 22, line 12 reads "comprising a an" should read -- comprising an --

Signed and Sealed this

Tenth Day of November, 2009

David J. Kappos  
*Director of the United States Patent and Trademark Office*